(12) United States Patent
Silder

(10) Patent No.: US 6,855,945 B1
(45) Date of Patent: Feb. 15, 2005

(54) ELECTRICALLY CONDUCTIVE SYNTHETIC DIAMOND APERTURES FOR ELECTRON AND OTHER PARTICULATE BEAM SYSTEMS

(76) Inventor: Stephen H. Silder, 3 Highridge Dr., Monroe, CT (US) 06468

( * ) Notice: Subject to any disclaimer, the term of this patent is extended or adjusted under 35 U.S.C. 154(b) by 137 days.

(21) Appl. No.: 10/350,705

(22) Filed: Jan. 27, 2003

(51) Int. Cl.$^7$ .............................. G21K 1/00; H01J 29/48
(52) U.S. Cl. .................................... 250/505.1; 313/447
(58) Field of Search ............................ 250/505.1, 306, 250/307, 310, 311; 313/146, 447, 452; 430/5

(56) References Cited

U.S. PATENT DOCUMENTS

| | | | |
|---|---|---|---|
| 3,823,408 A | * | 7/1974 | Gordon, III .................. 347/47 |
| 4,393,127 A | * | 7/1983 | Greschner et al. ............. 430/5 |
| 4,661,741 A | * | 4/1987 | Valun et al. ................. 313/452 |
| 4,951,429 A | * | 8/1990 | Hashish et al. ............. 451/102 |
| 5,355,380 A | * | 10/1994 | Lin et al. ........................ 372/5 |

* cited by examiner

*Primary Examiner*—Nikita Wells
*Assistant Examiner*—Christopher M. Kalivoda

(57) ABSTRACT

A thin flat disc with an orifice or orifices to size and control electron and other charged particulate beams. The disc is made of electrically conductive chemical vapor deposition (CVD) diamond. In addition the disc contains one or more high precision fine to ultra-fine orifices.

9 Claims, 4 Drawing Sheets

Typical Aperture Configuration

Typical Aperture Blank

Electrically Conductive CVD Diamond
Typical Face to Face Resistance 10 OHMS
Typical Face Finish 16 Micro-inches RMS

Typical Aperture Configuration

Section A-A

Process Development Sample

Alternate Variations

Step Cone

Bell Mouth

ELECTRICALLY CONDUCTIVE SYNTHETIC DIAMOND APERTURES FOR ELECTRON AND OTHER PARTICULATE BEAM SYSTEMS

BACKGROUND—DESCRIPTION OF PRIOR ART

Apertures, defined as discs containing one or more orifices, are used in numerous electron and other charged particulate beam systems. These apertures generally provide one of three functions. They serve either to:

1.) define the divergence angle of the electron beam from an emitting surface, which in turn determines the amount of aberrations ( i.e. spherical and chromatic) that the various beam controlling elements contribute to the focused particle beam, 2.) define the "object" bundle of electrons that subsequently becomes focused onto an image plane, or 3.) control the intensity of the charged particulate beam by varying the potential applied to the aperture.

Scientific, industrial, commercial, medical and military instruments employing electron and other particulate beams require beam defining and controlling apertures. Typical systems are: Scanning Electron Microscopes (SEM's), Transmission Electron Microscopes ( TEM's), Electron Beam Recorders ( EBR's), Electron Beam Lithography Systems ( EBL's )for generation of optical and X-Ray masks for Integrated Circuit (IC) fabrications, Direct Write Electron Exposure Systems for IC fabrication, Ion Beam and Implantation Systems and future Atomic Force Memory Systems.

The beam defining and controlling apertures used in these systems are made of metal, primarily platinum, molybdenum, tungsten, or metal foil on a backing. In many instruments the location of the aperture is such that it is bombarded by high current densities of high-energy particles. Such bombardment causes the apertures to become extremely hot. Under these conditions metal apertures can either melt down resulting in partial or total occlusion of the orifice or the orifice edges burn away thereby impairing the performance of the system. As the orifice size approaches 10 microns or less, the metals impose certain material restraints thereby limiting system performance. Among these are:

a.) Limitations on system throughput by having to limit beam power current to prevent metal aperture meltdown resulting in partial or total occlusion of the orifice.

b.) Limited life caused by gradual enlargement of the orifice with loss of spot size or feathering of orifice edges causing a "blooming" of the spot size.

Further, metal aperture manufacturing technology cannot produce aperture orifices smaller than 10 microns with tolerances of typically +/-0.2 microns that can withstand high-density particulate bombardment. The feasibility of using gold coated, electrically non-conductive diamond as a base material has been demonstrated. However, the comparatively fragile gold coating reduces the dimensional integrity and useful lifetimes of these apertures.

The ability of metals to conduct heat diminishes with elevated temperatures. This results in erosion of the aperture thereby limiting service life. Further, metal foil is not capable of withstanding high-density particulate bombardment.

Accordingly, besides the objects and advantages of the apertures described in my above patent, several object and advantages of the present invention are:

a.) to provide an aperture with vastly superior thermal conductivity which will remove the instrument system restraints on present and emerging technology.

b.) to provide an aperture with superior thermal stability which will assure system integrity c.) to provide an aperture that is chemically inert d.) to provide an aperture that has excellent electrical conductivity e.) to provide an aperture that can withstand high temperature cleaning without altering the critical orifice dimension f.) to provide an aperture which will extend service life g.) to provide an aperture which will yield high performance in ultrafine sizes below five microns h.) to provide an aperture which can have manufacturing tolerances as fine as +/-0.2 microns ensuring system integrity Further objects and advantages are to provide an aperture which is directly interchangeable, forward and backward, with metal apertures presently in service; relatively inexpensive to manufacture and providing superior instrument performance applications and capabilities heretofore unattainable.

Specifically, electrically conductive synthetic diamond apertures have the following desirable features:

a.) Vastly Superior Thermal Conductivity compared to any metal.

Diamond conducts heat faster and more reliably than any other material. A comparison of thermal conductivity for natural diamond, synthetic diamond, platinum, molybdenum and tungsten reveals the following:

| | W/CM° K |
|---|---|
| DIAMOND (Type 1 - Natural Monocrystalline) | |
| @20° C. | 9* |
| @190° C. | 24* |
| SYNTHETIC POLYCRYSTALLINE DIAMOND | 7–12*** |
| PLATINUM | 0.71* |
| MOLYBDENUM | |
| @500° C. | 1.22* |
| @1000° C. | 1.01* |
| @1500° C. | 0.82* |
| TUNGSTEN @ 18° C. | 1.47** |

*KIRK OTHMER/ENCYCLOPEDIA OF CHEMICAL TECHNOLOGY - 1978
**HANDBOOK OF CHEMISTRY AND PHYSICS 44th EDITION 1962–63
***GENA SYSTEMS MARCH 1990 b.) Superior Thermal Stability

Diamond is a dimensionally stable material. Compared to most metals, its expansion and contraction rate is very low. For example, it expands and contracts only one third as much a tungsten. Because of this low thermal expansion rate, diamond provides superior dimensional stability at elevated temperatures (621.9 Proceedings—International Diamond Conf. 1969).

c.) Chemically Inert

Diamond is virtually non-destructible.

BRIEF SUMMARY OF THE INVENTION

In accordance with the present invention an electron or other charged particulate defining and controlling aperture comprises a flat disc of electrically conductive synthetic diamond with one or more high precision orifices.

DETAILED DESCRIPTION OF THE INVENTION

Figure 1:
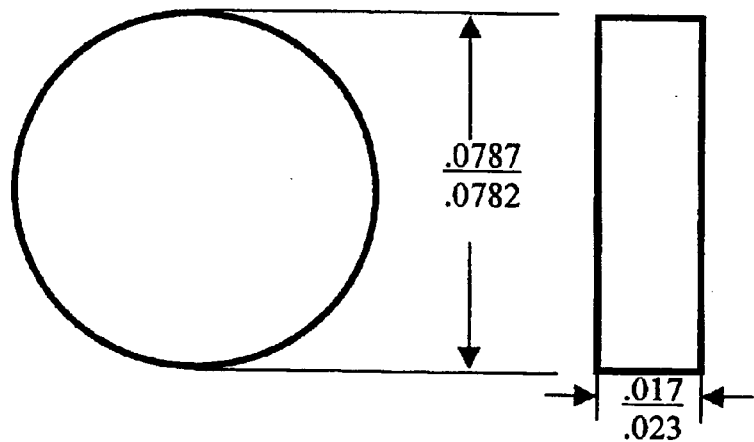
FIG. 1 shows an example of a typical aperture blank of the invention.

A preferred aperture embodiment of the present invention, is illustrated in FIG. 1. This embodiment is directly interchangeable, backward and forward, with metal apertures currently in use in most Scanning Electron Microscope and Electron Beam Recorders and other charged solid particulate beam instruments. The aperture is a low resistance, electrically conductive disc, either 2 mm or 3 mm in diameter with a thickness of 0.5 mm. The flat surfaces are polished to a 16 micro-inch finish or better. The aperture composition is boron doped chemical vapor deposition (CVD) diamond—available from Drukker International BV, the Netherlands, a subsidiary of DeBeers.

Figure 2:
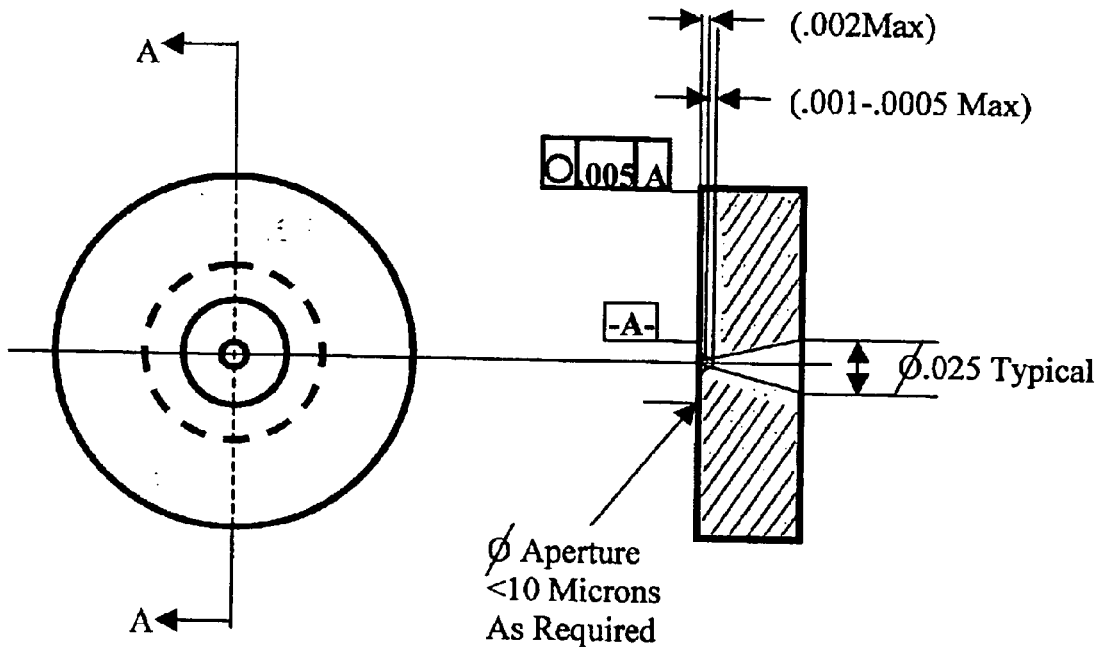
FIG. 2 shows a typical aperture configuration for the invention.

Generally, the beam sizing and controlling orifice through the aperture is on a precise central axis FIG. 2. The orifice consists of an entrance into the ultra-fine, high precision beam controlling diameter then continuing into the tapered exit. The entrance may have a taper. This leads into the ultra-fine orifice of the required size with a land of approximately 0.0005–0.001 inch (section A-A). The tapered exit meets the ultra-fine orifice and continues its enlargement to the far exiting side of the aperture.

One approach to developing the orifice is to drill the tapered exit from the exit side into a stationary or rotating aperture disc using a Deep UV laser beam thereby generating a blind hole with a nominal 0.010 inch diameter at the exit side. Some of the beam energy is dissipated by the aperture disc as the beam penetrates deeper, resulting in a tapered exit. 8100 pulses of a deep Uw laser beam, each pulsed for 10 nanoseconds duration, would penetrate approximately 90% of the 0.5 mm thickness. Thus generating a tapered hole of approximately 0.005 inch diameter at the base and a remaining web approximating 0.0010 to 0.0012 inches typical. A pulse energy of approximately 460 millijoules will effect this penetration. This calculates to approximately 0.05 microns ($2.3 \times 10^{-6}$ inches) of drilled hole per pulse. A DeepUV Excimer laser (Lumonix Pulse Master 886/888) suitable for this work is available from Photomachining, Pelham, N.H.

The ultra-fine orifice may be generated from the entrance face by reversing the aperture disc and refocusing the DeepUV laser beam to the diameter desired through the web. An alternate approach would be to drill the desired orifice from the entrance side through the web using Focused Ion Beam (FIB) machining available from Materials Analytical Services.

Figure 3:
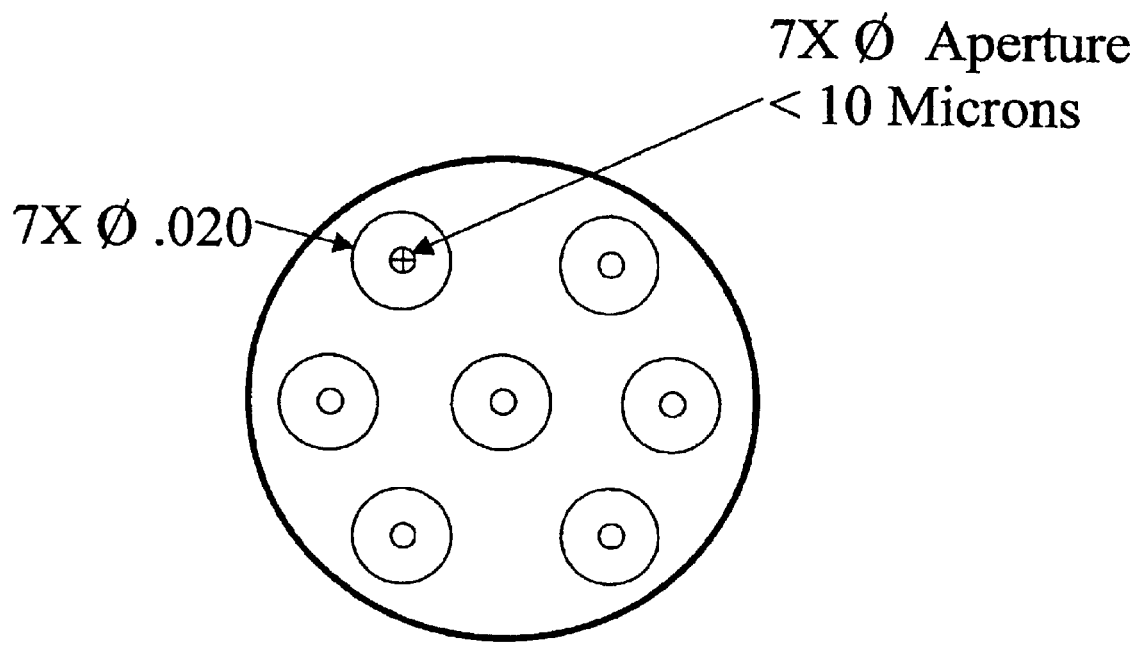
FIG. 3 shows an array of apertures.

There are various possibilities with regard to the multiplicity of orifices, their arrangement and their sizes. FIG. 3 shows a typical array. Further, additional embodiments can have geometrical configuration and size consistent with the economics of the application.

From the description above, a number of advantages of my electrically conductive synthetic CVD diamond aperture become evident:

a.) they are interchangeable, forward and backward, with metal apertures of the same size for SEM's, EBR's and other instruments requiring beam controlling apertures b.) they have the potential to extend the useful operational life between service maintenance c.) they have the ability to meet and exceed the demands of present and emerging technology d.) they eliminate the design constraints imposed by metal apertures e.) they have a useful service lifetime several times that of metal apertures f.) they can withstand multiple flame and ultrasonic cleanings and retain their critical dimensional integrity g.) ultrafine sizes in the 1–2 micron range and smaller—which was the domain of foil apertures—can be made of robust CVD diamond.

The manner of using electrically conductive CVD diamond apertures is identical to that for metal and foil apertures in present use. Namely, the electrically conductive CVD diamond aperture is directly interchangeable, forward and backward, with the 2 mm and 3 mm diameter by 0.5 mm thickness metal apertures currently in use.

Accordingly, the reader will see that the electrically conductive CVD diamond aperture can perform, in a superior manner, all the functions required of metal apertures.

Furthermore, the electrically conductive CVD diamond aperture has the additional advantages in that:

it does not impose the deleterious effect of imposing system constraints because of the metal or metal foil aperture limitations;

it provides a robust aperture body for 1–2 micron and smaller orifices which heretofore has been the exclusive domain of metal foil;

it provides a long life of service since it is chemically inert, with vastly superior thermal conductivity ensuring integrity of size;

in addition to superior performance in the ultra-fine size region it can provide the same beneficial long service in larger sizes such as 100 microns or more;

it retains its dimensional integrity after exposure to flame cleaning to remove system related contamination.

Figure 4:
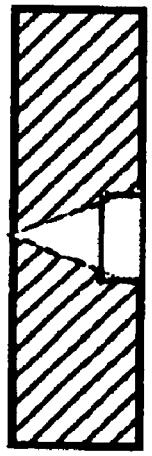
FIG. 4 describes alternate variations of the invention.
Figure 4:
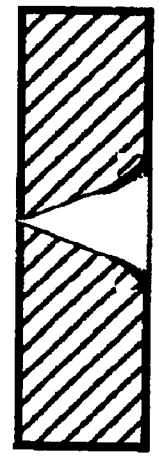

Although the description above contains many specificities, these should not be construed as limiting the scope of the invention but as merely providing illustrations of some of the presently preferred embodiments of this invention. For example, the aperture disc can have other shapes such as trapezoidal, triangular, etc.; the orifice exit can have other forms such as bell mouth or stepped cone FIG. 4, etc.

Thus the scope of the invention should be determined by the appended claims and their legal equivalents, rather than by the examples given.

I claim:

1. An aperture for defining and controlling electron and other particulate charged beam devices wherein said aperture comprises a robust body material made of non-metallic electrically conductive synthetic material and said robust body of material is composed of boron doped, synthetic polycrystalline diamond of 2 mm or 3 mm diameter with parallel body faces.

2. The aperture body of claim 1 wherein said robust body of material is capable of withstanding the bombardment of high current densities of high energy particles without deterioration at least 5 times better than any metal used for particulate aperture applications.

3. The aperture body of claim 1 wherein said aperture is a direct replacement, both forward and backward, for any standard commercial metal aperture of 2 mm or 3 mm diameter with a body thickness of 0.5 mm.

4. The aperture body of claim 1 wherein said aperture body can have any mechanical configuration selected from the group comprising circular, square, rectangle, triangle or other shape.

5. The aperture orifices of claim 1 wherein said aperture orifices have a larger diameter on the beam exiting side tapering from one side through said body to the desired entering beam controlling diameter.

6. The entering beam controlling diameter of claim 5 wherein the center of said beam controlling diameter is on the same axis as the exiting diameter.

7. The aperture body of claim 1 wherein said parallel body faces have highly polished surfaces of about 16 micro inch finish for ultra-fine orifices applications.

8. The robust body of the aperture in claim 1 wherein the robust body can support orifices in the ultra-fine range below 5 microns to sub-microns.

9. The robust body of the aperture in claim 1 wherein the robust body can support orifices larger than 5 microns to at least 100 microns.

* * * * *